United States Patent [19]
Lee

[11] Patent Number: 5,960,301
[45] Date of Patent: Sep. 28, 1999

[54] METHOD OF FORMING ISOLATION LAYER OF SEMICONDUCTOR DEVICE

[75] Inventor: Wook Ha Lee, Cheongju-si, Rep. of Korea

[73] Assignee: LG Semicon Co., Ltd., Chungcheongbuk-Do, Rep. of Korea

[21] Appl. No.: 08/829,473

[22] Filed: Apr. 16, 1997

[30] Foreign Application Priority Data

Nov. 6, 1996 [KR] Rep. of Korea ...................... 96-52218

[51] Int. Cl.⁶ ................................................ H01L 21/762
[52] U.S. Cl. ............................................ 438/445; 438/447
[58] Field of Search ..................................... 438/444, 445, 438/447, FOR 232

[56] References Cited

U.S. PATENT DOCUMENTS 5,432,118  7/1995  Orlowski et al. .

*Primary Examiner*—George Fourson
*Attorney, Agent, or Firm*—Morgan, Lewis & Bockius LLP

[57] ABSTRACT

A method of forming an isolation layer of a semiconductor device including active regions on a substrate and device isolation regions for isolating the active regions from one another includes the steps of forming a nitride layer on the active region of a semiconductor substrate, forming trenches of a predetermined depth in the semiconductor substrate at peripheral portions of the device isolation regions, and filling the trenches with a nitride material and performing a field oxidation process.

8 Claims, 6 Drawing Sheets

F I G.2a
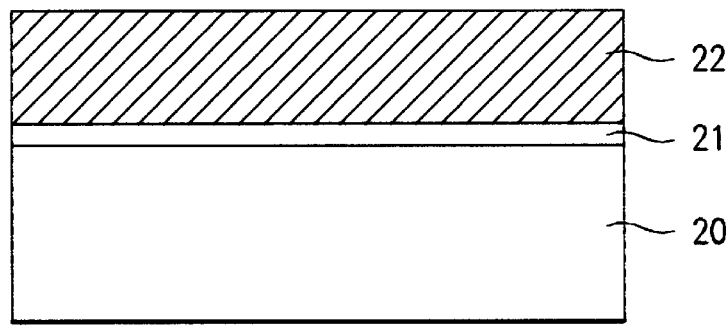
F I G.2b
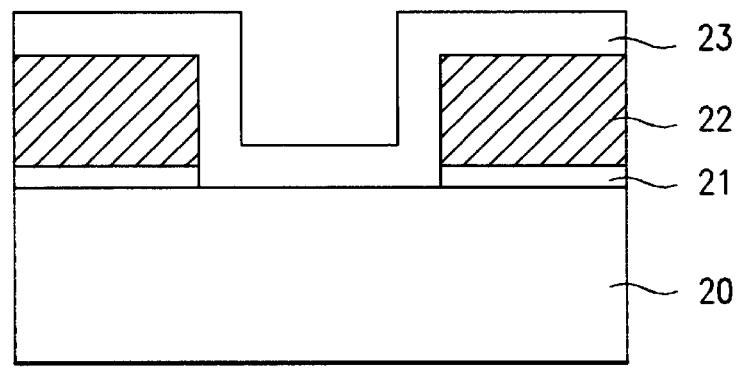
F I G.2c
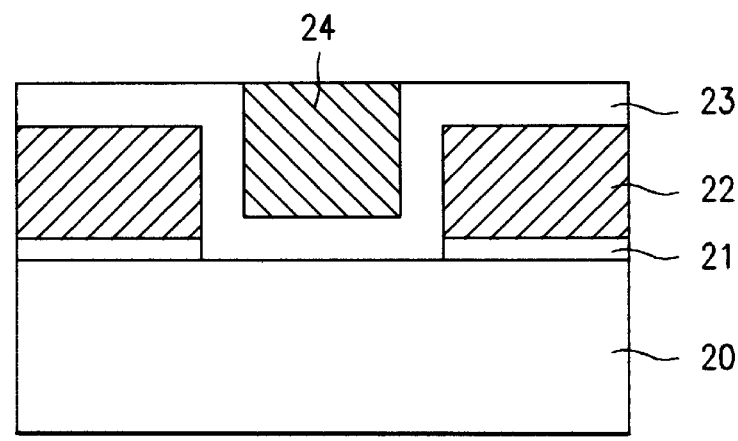

F I G.2f
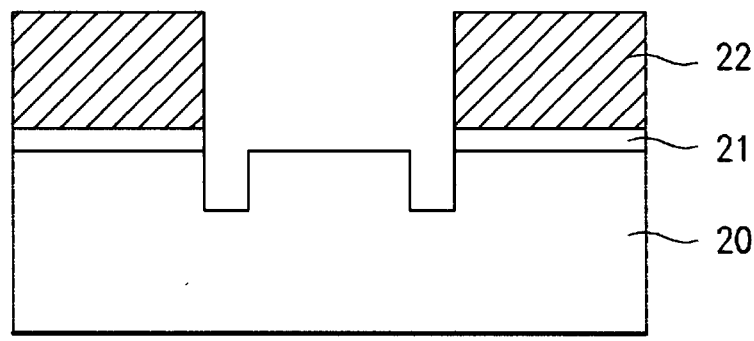
F I G.2g
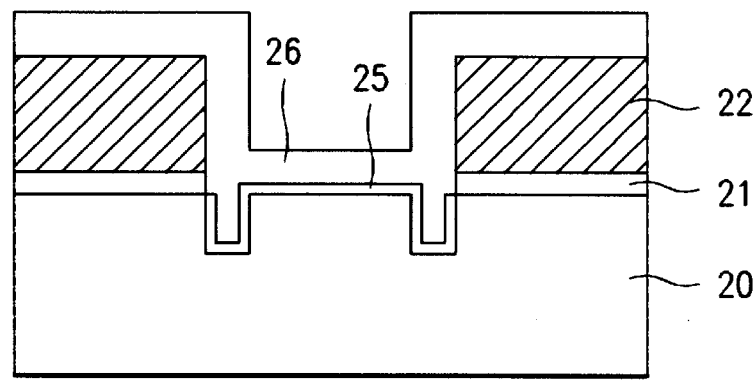
F I G.2h
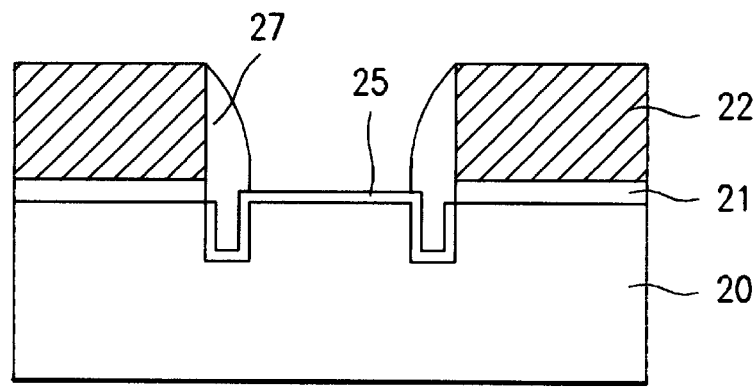

F I G.2i
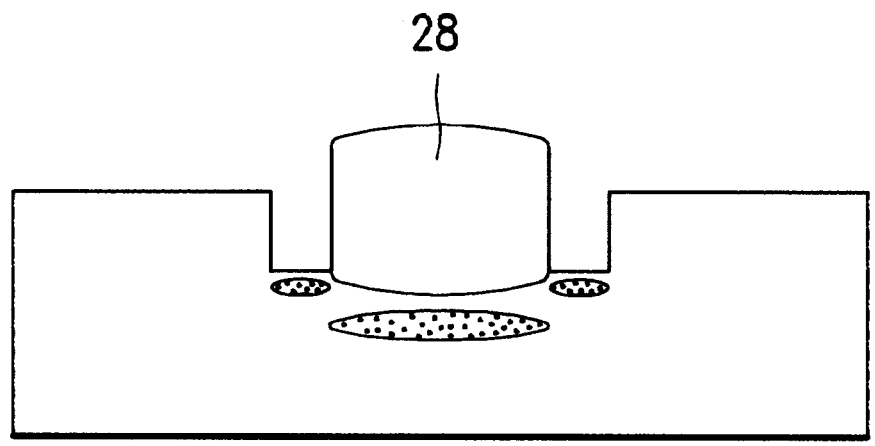
F I G.2j
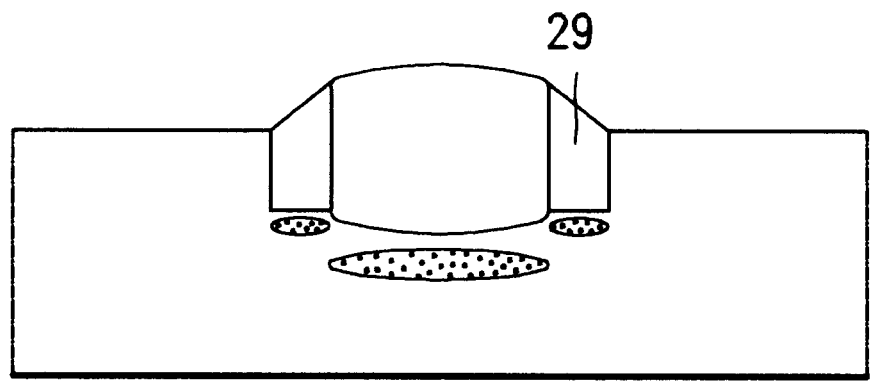

METHOD OF FORMING ISOLATION LAYER OF SEMICONDUCTOR DEVICE

This application claims the benefit of Application No. 52218/1996 filed in Korea on Nov. 6, 1996, which is hereby incorporated by reference.

BACKGROUND OF THE INVENTION

1. Field of the Invention

The present invention relates to a semiconductor device and, more particularly, to a method of forming an isolation layer of a semiconductor device.

2. Discussion of the Related Art

A conventional method of forming an isolation layer of a semiconductor device will be discussed with reference to the attached drawings. FIGS. 1a to 1f are cross-sectional views showing process steps of a conventional method of forming an isolation layer of a semiconductor device.

Referring to FIGS. 1a–1f, the conventional method utilizes a LOCOS (local oxidation of silicon) process using nitride sidewalls to form an isolation layer. As shown in FIG. 1a, on a semiconductor substrate 1, a pad oxide layer 2 is formed on which a first nitride layer 3 is deposited.

Referring to FIG. 1b, a photoresist layer is coated on the first nitride layer 3 and patterned so that the photoresist layer is removed over only a device isolation region. Using the remaining photoresist layer as a mask, the exposed first nitride layer 3 and the pad oxide layer 2 thereunder are etched. Then, the remaining photoresist layer used as the mask is removed.

Referring to FIG. 1c, on the exposed surface of the substrate 1, there is formed a thin oxide layer 4a. Then, a second nitride layer is deposited on the entire surface including the thin oxide layer 4a and is subjected to etch back, thereby forming nitride sidewalls 5 on the sides of the first nitride layer 3.

Referring to FIG. 1d, using the first nitride layer 3 and the nitride sidewalls 5 as masks, the exposed thin oxide layer 4a and the substrate 1 thereunder are etched.

As shown in FIG. 1e, the exposed surface of the substrate 1 is oxidized to form another thin oxide layer 4b. Then, a field ion implantation process is carried out. At this time, the thin oxide layer 4b is used to release stress generated in the substrate 1 during the field ion implantation process. Subsequently, a field oxidation process is performed with the first nitride layer 3 and the nitride sidewalls 5 serving as masks, thereby forming a field oxide layer 6 as shown in FIG. 1f. Next, the first nitride layer 3, the nitride sidewalls 5, and the pad oxide layer 2 are removed.

In the process of forming the device isolation layer according to the above method, a LOCOS process is carried out by using the nitride sidewalls 5. To prevent an abnormal growth of the field oxide layer 6, e.g. bird's beak, the substrate 1 in the field oxidation region is etched.

In the same etching process as discussed above, a trench is formed in the substrate 1 and a field oxidation process is carried out. As shown in FIG. 1f, step coverage occurs between the periphery portion of the field oxide layer 6 and the substrate 1. Therefore, the active region defined by the first field mask can prevent the field oxide layer from growing abnormally.

In a conventional method, a defined active region can prevent abnormal growth of a field oxide layer in an isolation layer. However, since the periphery portion of the field oxide layer is formed to be in a lower position than the position of the surface of the substrate, a gate line crossing the periphery portion of the field oxide layer causes step coverage in the following step, thereby degrading device characteristics.

The generation of step coverage affects device planarization and thus affects metal wiring, as well. Moreover, since the periphery portion of the field oxide layer is formed in a lower position than that of the surface of the substrate, the periphery portion causes a reduction in process tolerance, thereby causing difficulties in processing. Moreover, since the nitride sidewalls extend up to the sides of the substrate in the field oxidation process, the substrate receives a large amount of stress, thereby degrading electric characteristics of the device.

SUMMARY OF THE INVENTION

Accordingly, the present invention is directed to a method of forming isolation layer of semiconductor device that substantially obviates one or more of the problems due to limitations and disadvantages of the related art.

An object of the present invention is to provide a method of forming an isolation layer of a semiconductor device suitable for improving device characteristics.

Another object of the present invention is to provide a method of forming an isolation layer of a semiconductor device that prevents an abnormal growth of an oxide layer used as the isolation layer and releases stress generated in an active region.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming an isolation layer of a semiconductor device including active regions on a substrate and device isolation regions for isolating the active regions from one another comprises the steps of forming a nitride layer on the active region of a semiconductor substrate; forming trenches of a predetermined depth in the semiconductor substrate at peripheral portions of the device isolation region; and filling the trenches with a nitride material and subjecting a field oxidation process.

In another aspect of the present invention, a method of forming an isolation layer of a semiconductor device comprises the steps of successively forming a pad oxide layer and a first nitride layer on a semiconductor substrate, selectively etching the first nitride layer and the pad oxide layer to expose a portion of the semiconductor substrate corresponding to a device isolation region, successively forming a polysilicon layer and a spin on glass (SOG) layer on an entire surface of the first nitride layer including the exposed substrate, etching back the SOG layer to remove the SOG layer except over the device isolation region and exposing a portion of the polysilicon layer, etching the exposed portion of polysilicon layer using the SOG layer and the first nitride layer as masks and exposing a portion of the substrate, removing the SOG layer and etching back the exposed polysilicon layer and the substrate to form trenches in the substrate, forming a thin oxide layer on a surface of the substrate corresponding to the device isolation region and the trenches, performing a field ion implantation process over the device isolation region, forming a second nitride layer on an entire surface including a region where the field ions are injected, etching back the second nitride layer to form nitride sidewalls at sides of the first nitride layer and subjecting a field oxidation process to form a first field oxide layer, removing the first nitride layer, the nitride sidewalls, and the pad oxide layer under the first nitride layer, and forming a second field oxide layer to completely fill the trenches.

In a further aspect, a method of forming an isolation layer of a semiconductor device comprises the steps of successively forming a pad oxide layer and a first nitride layer on a semiconductor substrate, selectively etching the first nitride layer and the pad oxide layer to expose a portion of the semiconductor substrate corresponding to a device isolation region, successively forming a polysilicon layer and an spin on glass (SOG) layer on an entire surface of the first nitride layer including the exposed substrate, etching back the SOG layer to remove the SOG layer except over the device isolation region and exposing a portion of the polysilicon layer, etching the exposed polysilicon layer and the substrate to a predetermined depth using the SOG layer remaining only over the device isolation region and the first nitride layer as masks, and removing the SOG layer and polysilicon layer thereunder.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 2a to 2j, 2d' and 2e' are cross-sectional views showing process steps of a method for forming an isolation layer of a semiconductor device according to a preferred embodiment of the present invention.

DETAILED DESCRIPTION OF THE PREFERRED EMBODIMENTS

Figure 1A:
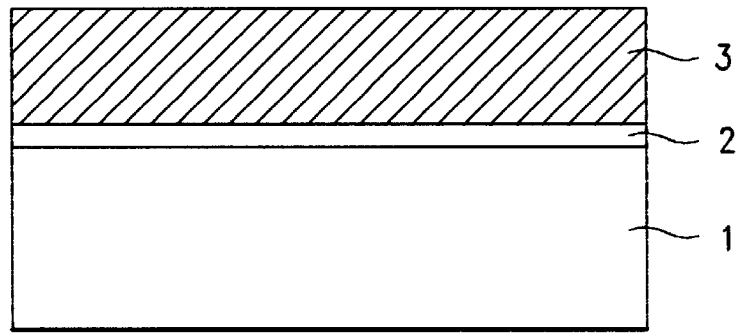
FIGS. 1a to 1f are cross-sectional views showing process steps of a conventional method for forming an isolation layer of a semiconductor device.
Figure 1B:
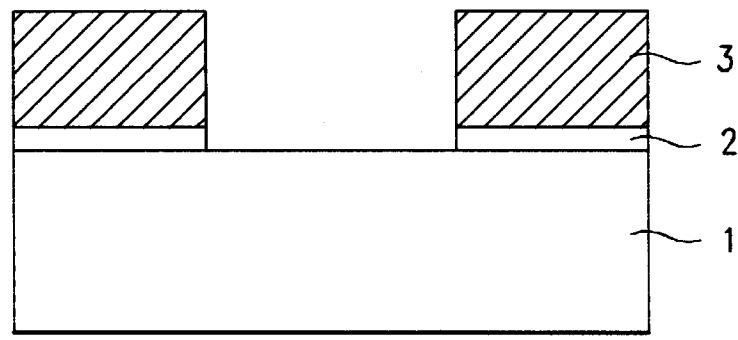
Figure 1C:
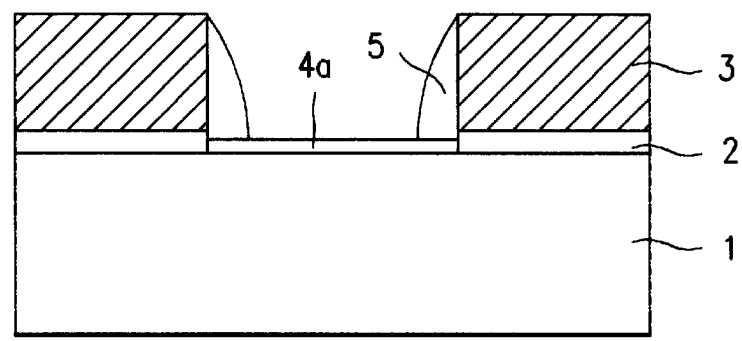
Figure 1D:
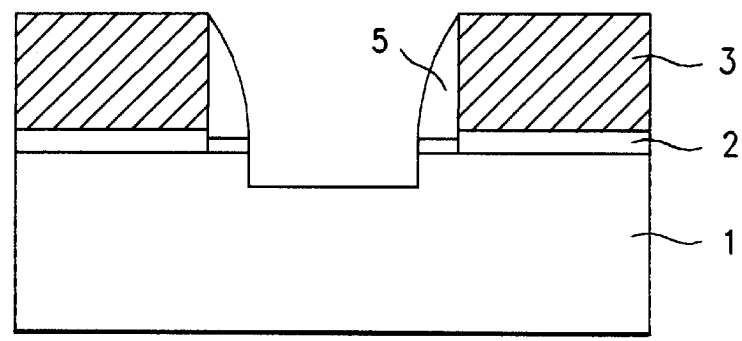
Figure 1E:
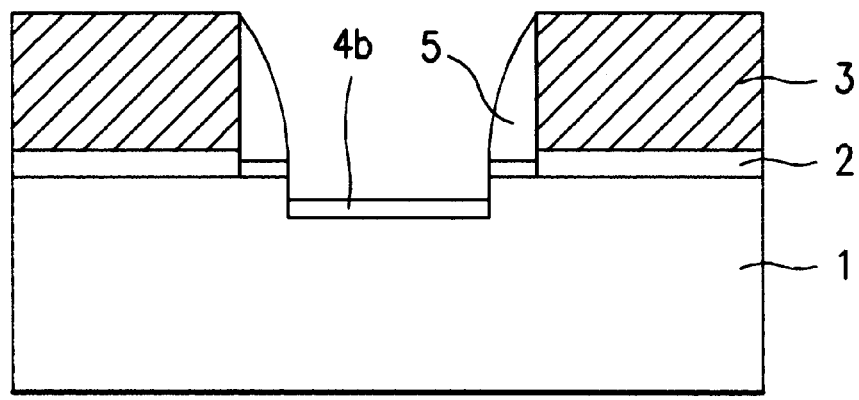
Figure 1F:
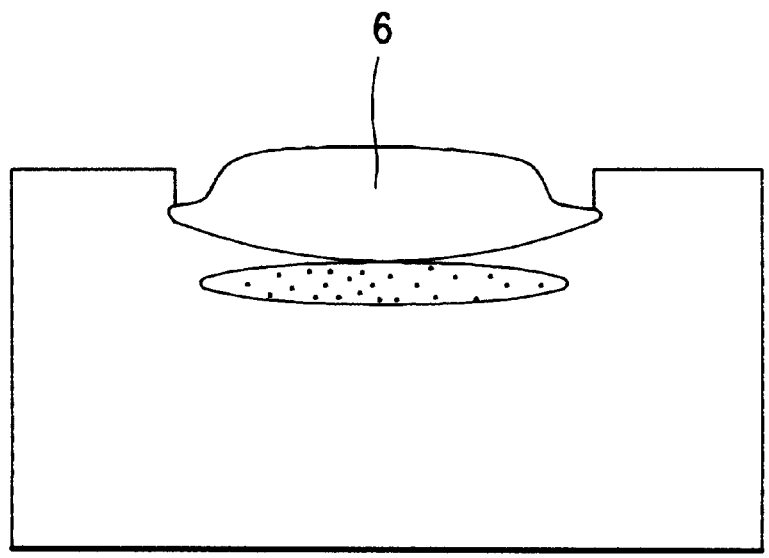

Reference will now be made in detail to the preferred embodiments of the present invention, examples of which are illustrated in the accompanying drawings.

FIGS. 2a through 2f show a method of forming an isolation layer of a semiconductor device according to a preferred embodiment of the invention.

Referring initially to FIG. 2a, on a semiconductor substrate 20, a pad oxide layer 21 is formed, on which a first nitride layer 22 is deposited. Next, referring to FIG. 2b, the first nitride layer 22 and the pad oxide layer 21 over a defined device isolation region are selectively etched until the surface of the substrate 20 is exposed, thereby a forming a trench. Then, a polysilicon layer 23 is formed on the entire surface of the first nitride layer 22 including the exposed substrate 20. Subsequently, an SOG (spin on glass) layer 24 is formed on the polysilicon layer 23 and then subjected to etch back, so that the SOG layer 24 remains only in the trench, as shown in FIG. 2c.

Figure 2D:
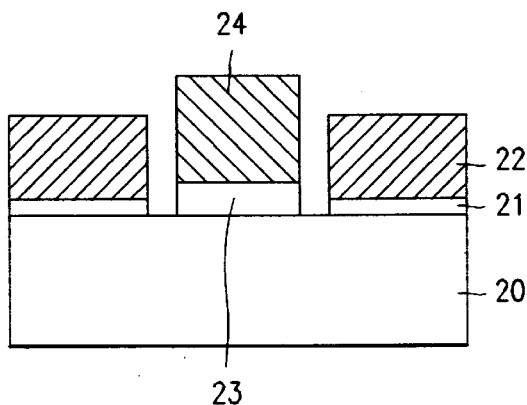
Figure 2D:
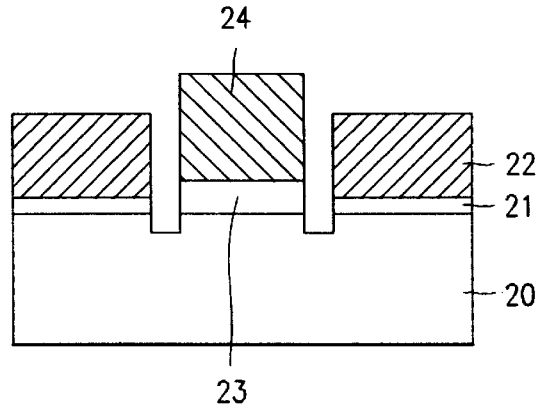
Figure 2E:
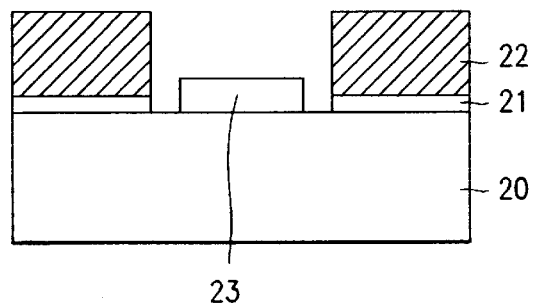
Figure 2E:
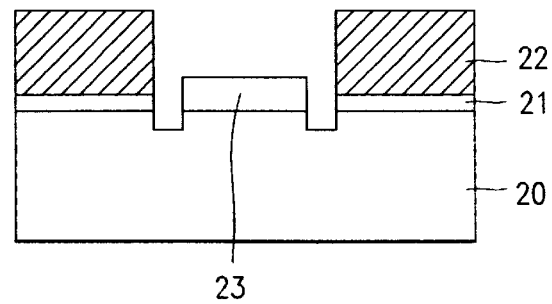

There are two methods for etching the substrate 20 to a predetermined depth at the peripheral portion over the device isolation region where the trench is formed. In one of the two methods, with the SOG layer 24 and the first nitride layer 22 serving as masks, the exposed polysilicon layer 23 is etched to expose the substrate 20, as shown in FIG. 2d. Here, the ratio of the etch rate of polysilicon to the etch rate of the SOG or the first nitride layer is preferably greater than 10:1. Next, the SOG layer 24 is removed, as shown in FIG. 2e. Then, the exposed polysilicon layer 23 and the substrate 20 are subjected to etch back to form a trench in the substrate 20, as shown in FIG. 2f. The polysilicon layer 23 and the substrate 20 are preferably etched simultaneously. Here, the polysilicon 23 and the substrate 20 may be made of a same material and/or have a similar etch rate such that the depth of the trench formed in the substrate 20 corresponds to the thickness of the polysilicon 23.

In the other or alternative method, as shown in FIG. 2d', with the SOG layer 24 serving as a mask, the exposed polysilicon layer 23 is preferably dry etched to expose the first nitride layer 22. Thus, the polysilicon 23 over the nitride layer 22 is removed to expose the upper surface of the nitride layer 22. Then, with the exposed first nitride layer 22 and the SOG layer 24 serving as masks, the exposed polysilicon layer 23 and the substrate 20 are preferably continuously etched to a predetermined depth within the substrate 20. Next, the remaining SOG layer 24 and the polysilicon layer 23 are removed, as shown in FIGS. 2e' and 2f. Accordingly, in the alternative method, the nitride layer 22 is exposed through the dry etch process and as the dry etch process continues, the exposed nitride layer 22 also acts as a mask to expose the polysilicon layer 23 and the substrate 20.

In any one of the two above-stated methods, a trench is formed to a predetermined depth in the substrate 20 at the peripheral portion of the device isolation region, as shown in FIG. 2f. Then, a thin oxide layer 25 is formed on the surface of the substrate 20 including the trench, as shown in FIG. 2g. Next, a field ion implantation process is carried out over the device isolation region, and then a second nitride layer 26 is formed on the entire surface including the device isolation region.

Referring to FIG. 2h, the second nitride layer 26 is subjected to etch back to form nitride sidewalls 27 on the sides of the first nitride layer 22. Referring to FIG. 2i, with the first nitride layer 22 and the nitride sidewalls 27 serving as masks, a field oxidation process is performed to form a first field oxide layer 28. Then, the first nitride layer 22, the nitride sidewalls 27, and the pad oxide layer 21 under the first nitride layer 22 are removed.

Referring to FIG. 2j, by using a chemical vapor deposition (CVD) method, an oxide layer is formed on the entire surface including the trench portion where the nitride sidewalls 27 were removed. Then, the oxide layer is subjected to etch back to form a second field oxide layer 29 filling in the trench portion.

Accordingly, in the present invention, the substrate 20 at the peripheral portion of the device isolation region is etched to a predetermined depth, and then nitride sidewalls 27 are formed on the etched portions. Next, a field oxidation process is performed with the nitride sidewalls as masks. Thus, in the present invention, an abnormal growth of an oxide layer, which is used as the isolation layer, is prevented and generation of stress in an active region is reduced, for improving device characteristics.

The method of the present invention has the following advantages.

First, a peripheral portion of a device isolation region is not formed at a lower position than that of a surface of the substrate by introducing O₂ in an active region during the field oxidation process.

Second, stress generated at sides of the trench is released or relieved to prevent the sides of the trench from acting as a leakage current source.

Third, the prevent invention prevents the bird's beak phenomenon so that process tolerance with respect to a thickness of a pad oxide layer is increased.

It will be apparent to those skilled in the art that various modification and variations can be made in the method of forming isolation layer of a semiconductor device of the present invention without departing from the spirit or scope of the inventions. Thus, it is intended that the present invention cover the modifications and variations of this invention provided they come within the scope of the appended claims and their equivalents.

What is claimed is:

1. A method of forming an isolation layer of a semiconductor device, the method comprising the steps of:

successively forming a pad oxide layer and a first nitride layer on a semiconductor substrate;

selectively etching the first nitride layer and the pad oxide layer to expose a portion of the semiconductor substrate corresponding to a device isolation region;

successively forming a polysilicon layer and a spin on glass (SOG) layer on an entire surface of the first nitride layer including the exposed substrate;

etching back the SOG layer to remove the SOG layer except over the device isolation region and exposing a portion of the polysilicon layer;

etching the exposed portion of polysilicon layer using the SOG layer and the first nitride layer as masks and exposing a portion of the substrate;

removing the etched SOG layer and etching back the resulting exposed polysilicon layer and the substrate to form trenches in the substrate;

forming an oxide layer on a surface of the substrate corresponding to the device isolation region and the trenches;

performing a field ion implantation process over the device isolation region;

forming a second nitride layer on an entire surface including a region where the field ions are injected;

etching back the second nitride layer to form nitride sidewalls at sides of the first nitride layer and subjecting a field oxidation process to form a first field oxide layer;

removing the first nitride layer, the nitride sidewalls, and the pad oxide layer under the first nitride layer; and forming a second field oxide layer to completely fill the trenches.

2. The method as claimed in claim 1, wherein the step of forming the second field oxide layer includes the step of forming an oxide layer on an entire surface including the trenches by using a chemical vapor deposition method.

3. A method of forming an isolation layer of a semiconductor device, the method comprising the steps of:

successively forming a pad oxide layer and a first nitride layer on a semiconductor substrate;

selectively etching the first nitride layer and the pad oxide layer to expose a portion of the semiconductor substrate corresponding to a device isolation region;

successively forming a polysilicon layer and an spin on glass (SOG) layer on an entire surface of the first nitride layer including the exposed substrate;

etching back the SOG layer to remove the SOG layer except over the device isolation region and exposing a portion of the polysilicon layer;

etching the exposed polysilicon layer and the substrate to a predetermined depth using the SOG layer remaining only over the device isolation region and the first nitride layer as masks;

removing the etched SOG layer and polysilicon layer thereunder;

forming an oxide layer on a surface of the substrate corresponding to the device isolation region and the trenches;

performing a field ion implantation process over the device isolation region;

forming a second nitride layer on an entire surface including a region where the field ions are injected;

etching back the second nitride layer to form nitride sidewalls at sides of the first nitride layer and subjecting a field oxidation process to form a first field oxide layer;

removing the first nitride layer, the nitride sidewalls, and the pad oxide layer under the first nitride layer; and forming a second field oxide layer to completely fill the trenches.

4. The method as claimed in claim 3, wherein the step of forming the second field oxide layer includes the step of forming an oxide layer on an entire surface including the trenches by using a chemical vapor deposition method.

5. A method of forming an isolation layer of a semiconductor device including active regions on a semiconductor substrate and device isolation regions for isolating the active regions from one another, the method comprising the steps of:

successively forming a pad oxide layer and a nitride layer on the semiconductor substrate in at least one of the active regions, the step of successively forming the oxide layer and the nitride layer including the steps of:
   successively forming the pad oxide layer and the nitride layer on the semiconductor substrate, and
   selectively etching the nitride layer and the pad oxide layer to expose a portion of the semiconductor substrate corresponding to the at least one of the device isolation regions;

forming a polysilicon layer over the etched nitride layer and the exposed portion of the semiconductor substrate;

forming a spin on glass (SOG) layer in the at least one of the device isolation regions on the polysilicon layer;

forming trenches of a predetermined depth in the semiconductor substrate between at least one of the device isolation regions and the active regions adjacent to the at least one of the device isolation regions; and filling the trenches with a nitride material and performing a field oxidation process.

6. The method as claimed in claim 5, wherein the polysilicon layer and the semiconductor substrate are made of the same material.

7. The method as claimed in claim 5, wherein the polysilicon layer and the semiconductor substrate have substantially the same etch rate.

8. The method as claimed in claim 5, wherein the step of forming the trenches includes the step of etching portions of the polysilicon layer not covered by the SOG layer and portions of the semiconductor substrate corresponding to the trenches to the predetermined depth.

* * * * *